(12) United States Patent
Lee

(10) Patent No.: US 7,482,279 B2
(45) Date of Patent: Jan. 27, 2009

(54) METHOD FOR FABRICATING SEMICONDUCTOR DEVICE USING ARF PHOTOLITHOGRAPHY CAPABLE OF PROTECTING TAPERED PROFILE OF HARD MASK

(75) Inventor: Sung-Kwon Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 107 days.

(21) Appl. No.: 11/347,079

(22) Filed: Feb. 2, 2006

(65) Prior Publication Data
US 2006/0124587 A1 Jun. 15, 2006

Related U.S. Application Data

(62) Division of application No. 10/648,172, filed on Aug. 25, 2003, now Pat. No. 7,026,253.

(30) Foreign Application Priority Data
Dec. 27, 2002 (KR) .............................. 2002-85131
Dec. 30, 2002 (KR) .............................. 2002-86489

(51) Int. Cl.
*H01L 21/302* (2006.01)
(52) U.S. Cl. .................. 438/725; 438/636; 438/671; 438/704; 438/745; 430/5
(58) Field of Classification Search .................. 430/5; 438/636, 671, 704, 725, 745, 950, 952
See application file for complete search history.

(56) References Cited

U.S. PATENT DOCUMENTS

| 6,020,269 | A  | * | 2/2000 | Wang et al. ............ 438/717 |
| 6,171,763 | B1 | * | 1/2001 | Wang et al. ............ 430/318 |
| 6,200,907 | B1 | * | 3/2001 | Wang et al. ............ 438/718 |
| 6,268,287 | B1 | * | 7/2001 | Young et al. ........... 438/671 |
| 6,479,391 | B2 |   | 11/2002 | Morrow et al. |
| 6,503,830 | B2 | * | 1/2003 | Miyata ................. 438/637 |
| 6,524,964 | B2 |   | 2/2003 | Yu |
| 6,548,423 | B1 | * | 4/2003 | Plat et al. ............. 438/780 |
| 6,627,557 | B2 | * | 9/2003 | Seta et al. ............. 438/717 |
| 6,632,744 | B2 | * | 10/2003 | Imai et al. ............ 438/692 |

(Continued)

*Primary Examiner*—George A. Goudreau
(74) *Attorney, Agent, or Firm*—Blakely, Sokoloff, Taylor & Zafman

(57) ABSTRACT

A method for fabricating a conducting layer pattern using a hard mask of which a upper surface is flattened by the use of ArF exposure light source. The method includes the steps of: forming a conducting layer on a semiconductor substrate; forming a first hard mask layer, a second hard mask layer and a third hard mask layer on the conducting layer in order; forming a photoresist pattern on the third hard mask layer using an ArF exposure light source in order to form a predetermined pattern; forming a first hard mask pattern by etching the third hard mask layer using the photoresist pattern as an etching mask; forming a second hard mask pattern by etching the second hard mask layer using the first hard mask pattern as an etching mask; removing the first hard mask pattern; and etching the first hard mask layer and the conducting layer using the second hard mask pattern as an etching mask and forming a stacked hard mask pattern having the conducting layer and the second and first hard mask patterns, whereby a spire-shaped pattern is removed from the stacked hard mask pattern.

10 Claims, 12 Drawing Sheets

U.S. PATENT DOCUMENTS 6,815,333 B2 * 11/2004 Townsend et al. ............ 438/623
7,026,253 B2 *  4/2006 Lee ............................ 438/717
2002/0142537 A1   10/2002 Ho
2005/0037605 A1 *  2/2005 Kim et al. ................... 438/622

* cited by examiner

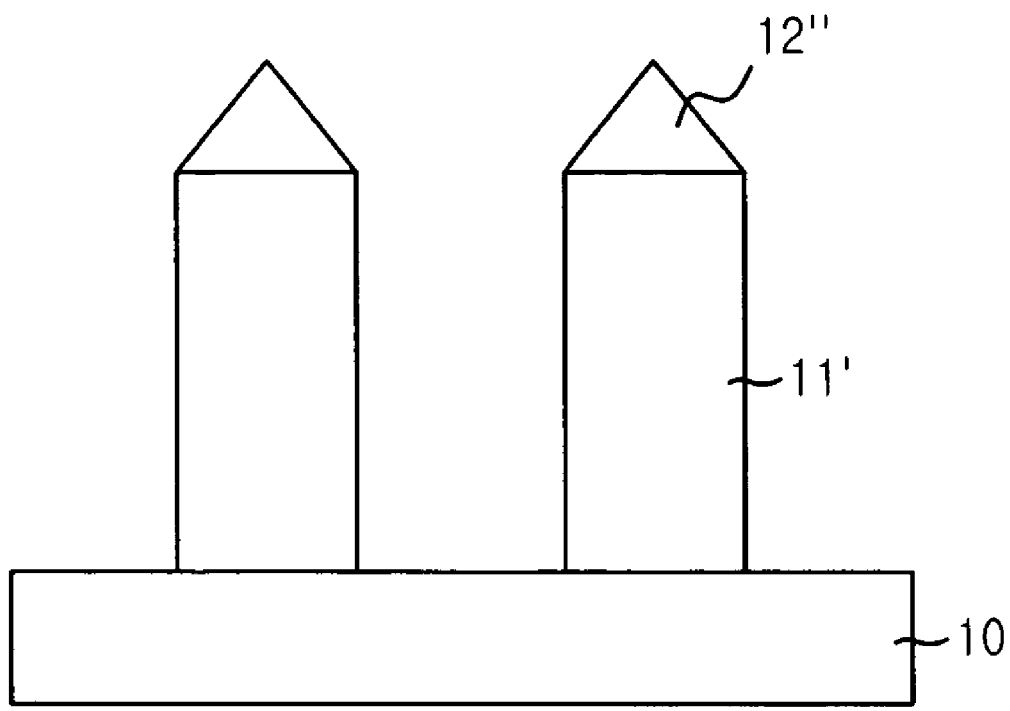

METHOD FOR FABRICATING SEMICONDUCTOR DEVICE USING ArF PHOTOLITHOGRAPHY CAPABLE OF PROTECTING TAPERED PROFILE OF HARD MASK

The present patent application is a Divisional of application Ser. No. 10/648,172, filed Aug. 25, 2003.

FIELD OF THE INVENTION

The present invention relates to a method for fabricating a pattern in a semiconductor device; and, more particularly, to a method for fabricating a conducting layer pattern using a hard mask of which an upper surface is flattened by the use of an ArF exposure light source.

DESCRIPTION OF THE PRIOR ART

With the integration of semiconductor devices, the distance between patterns is getting smaller and the height of a photoresist layer, as an etching mask, is also getting lower. As the thickness of photoresist layer becomes thinner, the photoresist layer dose not perfectly function as an etching mask to etch an oxide layer or other layers in forming a high aspect ratio contact hole or a self-aligned contact hole. Therefore, a high quality hard mask has been required to guarantees a high selective etching process with a high aspect ratio.

Various layers, such as a nitride layer and a polysilicon layer, have been used as hard masks and a processing margin must be used in a selective etching process of a photoresist layer which uses hard masks. Further, by minimizing a loss of critical dimension (hereinafter, referred to as a "CD"), CD bias (difference between the photoresist pattern and an actually formed pattern) is reduced.

However, when a nitride hard mask is used, with the decrease of the design rule, the thickness of the nitride layer is decreased. In order to obtain a high selective etching ratio for the nitride layer in an oxide layer etching process, a large amount of polymer generating gas is used at the time a contact hole is formed. This large amount of polymer causes a reappearance problem and a reduced contact area. The reduced contact area is caused by a slope etching profile which results in a metal connection having a high resistance in the contact hole.

On the other hand, this problem caused by the polymer generating gas can be overcome, but it is very difficult to obtain a high selective etching ratio for a silicon material including a semiconductor substrate when the polysilicon layer is removed. Particularly, using a photoresist layer to form fine patterns using an ArF exposure light source, an adhesion problem is also caused and further polysilicon hard mask patterning itself becomes difficult. In a bit line and a word line, the depth of the etching target increases with the increase of a vertical thickness of these lines. Also, in order to form the bit line and word line, a noble metal having high etching barrier characteristics is used as a hard mask. A dual hard mask consisting of a nitride and the noble metal is also used.

FIGS. 1A to 1C are cross-sectional views illustrating a conventional method for forming a conducting layer in a semiconductor device.

First, referring to FIG. 1A, a conducting layer 10 to be etched is formed on a semiconductor substrate (not shown) on which different elements have been formed. A nitride layer 11 for a first hard mask and a tungsten layer 12 for a second hard mask are in order formed on the conducting layer 10. In order to prevent random reflection in the photolithography process and to improve adhesive strength to the lower layer for an ArF photoresist layer, an antireflective coating layer 13 is formed on the tungsten layer 12 and a photoresist layer 14 for forming a pattern (gate electrode) is formed on the antireflective coating layer 13. The conducting layer 10 is a stacked layer of a polysilicon layer and a tungsten layer and the antireflective coating layer 13 is an organic layer.

Referring to FIG. 1B, the antireflective coating layer 13 and the tungsten layer 12 for the second hard mask are in order etched using the photoresist layer 14 as an etching mask, thereby forming an antireflective coating pattern 13' and a second hard mask pattern 12' with the formation of the photoresist pattern 14'.

Subsequently, referring to FIG. 1C, a first hard mask pattern 11' is formed using the photoresist pattern 14', the antireflective coating pattern 13' and the second hard mask pattern 12' as an etching mask, thereby forming a staked hard mask pattern consisting of the first and second hard mask patterns.

As shown in FIG. 1C, a spire-shaped hard mask pattern 12" is formed on the second hard mask pattern 12' when the first hard mask pattern 11' is formed and this is caused by a tapered etching process of the second hard mask pattern 12'.

FIG. 2 is a photograph taken by a SEM showing such a spire-shaped top portion formed on the second hard mask pattern 12' and FIG. 3 is a photograph taken by a SEM showing a conducting layer pattern formed by etching the conducting layer.

The spire-shaped hard mask pattern 12" is shown in FIG. 2. Referring to FIG. 3, the first hard mask pattern 11" also has a spire-shaped top portion to form a spire-shaped hard mask pattern 11" because the first hard mask pattern 11' is etched by using the spire-shaped hard mask pattern 12" as an etching mask.

FIG. 4 is a photograph taken by a TEM showing a conducting layer pattern having a stacked structure of the tungsten layer and the polysilicon layer. The conducting layer pattern 10' is formed by stacking a polysilicon layer pattern 10b and a tungsten layer pattern 10a and the spire-shaped hard mask pattern 11" is formed on the conducting layer pattern 10' because the spire-shaped hard mask pattern 12" is projected to the first hard mask pattern 11'.

As stated above, the spire shape of the hard mask causes some problems as follows:

1) This causes a difference in thickness of the first hard mask of a nitride layer between a cell area and a peripheral area. This means a thickness difference of the first hard mask according to the size of the conducting layer. For example, the more the line size of the conducting layer increases, the more the thickness of the first hard mask increases. In a 100 nm line techniques, the first hard mask may have a difference of 400Å-500Å in thickness between a cell area and a peripheral area.

2) When depositing a plug material to form a plug between conducting layer patterns and performing planarization and isolation processes, it is very difficult to control the thickness of the first hard mask because the polishing rate dramatically increases at the spire-shaped portion. This may cause SAC defects to make the semiconductor device fail.

3) In the line techniques not exceeding 70 nm design rule, the spire-shaped portion may increase device failure.

Accordingly, it is necessary to develop an improved process to prevent the spire or round-shaped portion of the hard mask from being generated in etching and patterning processes.

SUMMARY OF THE INVENTION

An object of the present invention is to provide a method for fabricating a conducting layer pattern in which a tapered etching of a hard mask for patterning a conducting layer is prevented.

Another object of the present invention is to provide an improved method for forming an etching mask having no spire or round-shaped portion at the top of etching mask patterns.

In accordance with an aspect of the present invention, there is provided a method for fabricating a semiconductor device using an ArF exposure light source comprising the steps of: forming a conducting layer on a semiconductor substrate; forming a first hard mask layer, a second hard mask layer and a third hard mask layer on the conducting layer in order; forming a photoresist pattern on the third hard mask layer using an ArF exposure light source in order to form a predetermined pattern; forming a first hard mask pattern by etching the third hard mask layer using the photoresist pattern as an etching mask; forming a second hard mask pattern by etching the second hard mask layer using the first hard mask pattern as an etching mask; removing the first hard mask pattern; and etching the first hard mask layer and the conducting layer using the second hard mask pattern as an etching mask and forming a stacked hard mask pattern having the conducting layer and the second and first hard mask patterns.

In accordance with another aspect of the present invention, there is provided a method for fabricating a semiconductor device using an ArF exposure light source comprising the steps of: forming a conducting layer on a semiconductor substrate; forming a first hard mask layer, a second hard mask layer and a third hard mask layer on the conducting layer in order; forming a photoresist pattern on the third hard mask layer using an ArF exposure light source in order to form a predetermined pattern; forming a first hard mask pattern by etching the third hard mask layer using the photoresist pattern as an etching mask; etching the second hard mask layer and the first hard mask layer using at least the first hard mask pattern and forming a triple stacked hard mask pattern having the first hard mask pattern, a second hard mask pattern and a third hard mask pattern; and etching the conducting layer using triple stacked hard mask pattern as an etching mask and simultaneously removing the first hard mask pattern, whereby a stacked structure having the conducting layer, the second hard mask pattern and the third hard mask pattern is formed.

In accordance with a further aspect of the present invention, there is provided a method for fabricating a semiconductor device using an ArF exposure light source comprising the steps of: forming a conducting layer on a semiconductor substrate; forming a first hard mask layer and a second hard mask layer on the conducting layer in order; forming a photoresist pattern on the second hard mask layer using an ArF exposure light source in order to form a predetermined patter; forming a first hard mask pattern by etching the second hard mask layer using the photoresist pattern as an etching mask; etching the first hard mask layer using al least the first hard mask pattern and forming a second hard mask pattern, thereby forming a first resulting structure; depositing an insulation layer on the first resulting structure; and patterning the conducting layer using the second hard mask pattern as an etching mask.

In this invention, a conducting layer is patterned by a triple stacked hard mask to prevent a spire-shaped mask pattern. Since a spire-shaped pattern is removed from a triple stacked hard mask before etching the conducting layer, there is not any distortion of the pattern profile of the conducting layer.

Alternatively, a conducting layer is patterned by a dual stacked hard mask to prevent a spire-shaped mask pattern. The dual stacked hard mask is formed by three wet etching processes to remove a spire-shaped pattern.

BRIEF DESCRIPTION OF THE DRAWINGS

The above and other objects and features of the instant invention will become apparent from the following description of preferred embodiments taken in conjunction with the accompanying drawings, in which:

FIG. 1A to 1C are cross-sectional views illustrating a conventional method for forming a conducting layer pattern in a semiconductor device.

DETAILED DESCRIPTION OF THE PREFERRED EMBODIMENTS

Hereinafter, a method for fabricating a conducting layer pattern according to the present invention will be described in detail below.

FIG. 5A to 5D are cross-sectional views illustrating a method for forming a conducting layer pattern in a semiconductor device according to a first embodiment of the present invention.

Figure 1A:
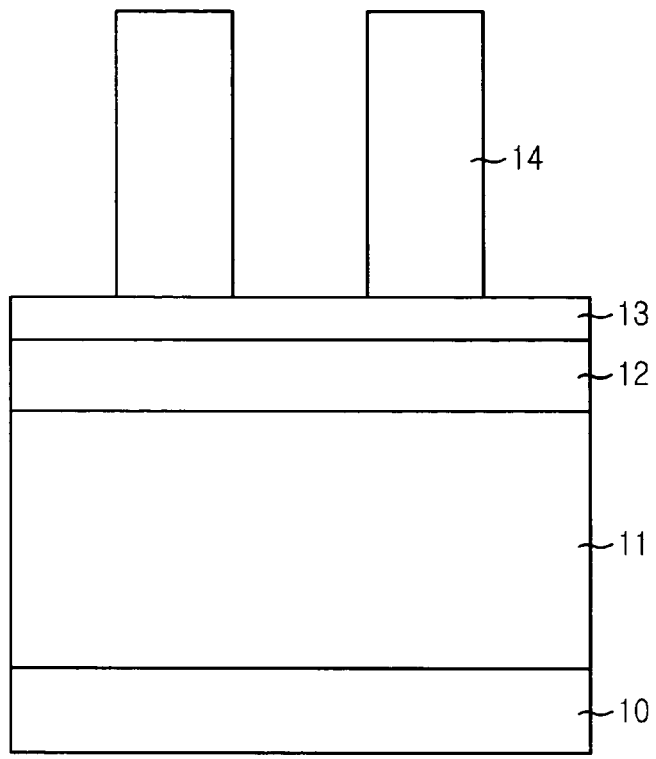
Figure 1B:
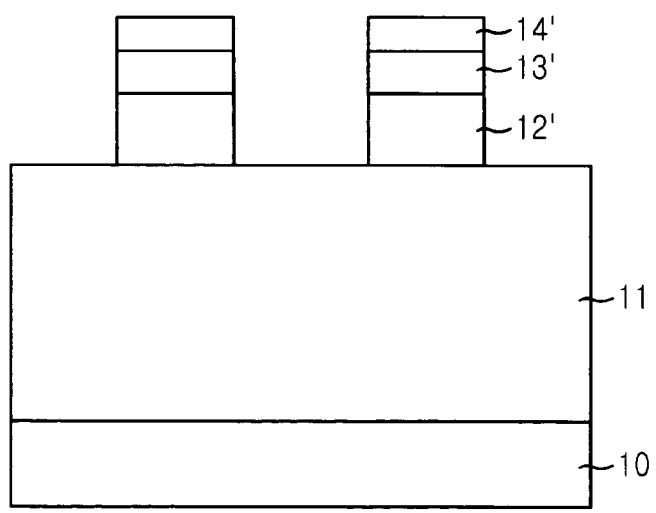
Figure 2:
FIG. 2 is a photograph taken by a SEM showing a spire-shaped top portion formed on a hard mask pattern.
Figure 3:
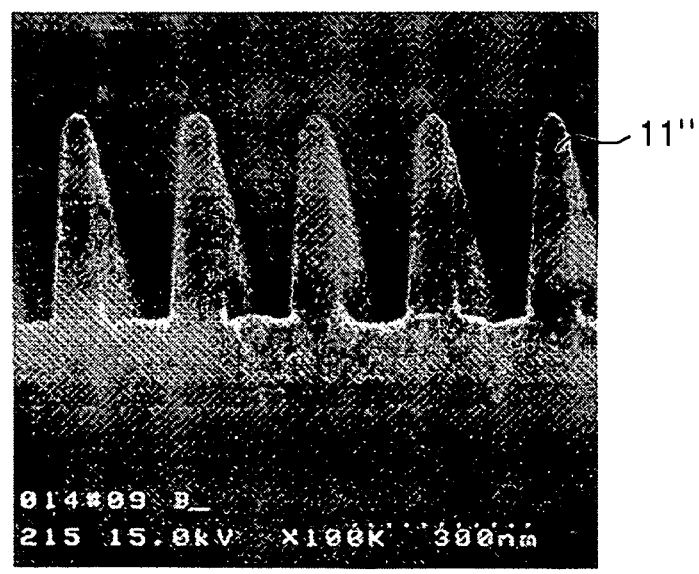
FIG. 3 is a photograph taken by a SEM showing a conducting layer pattern formed by etching a conducting layer.
Figure 4:
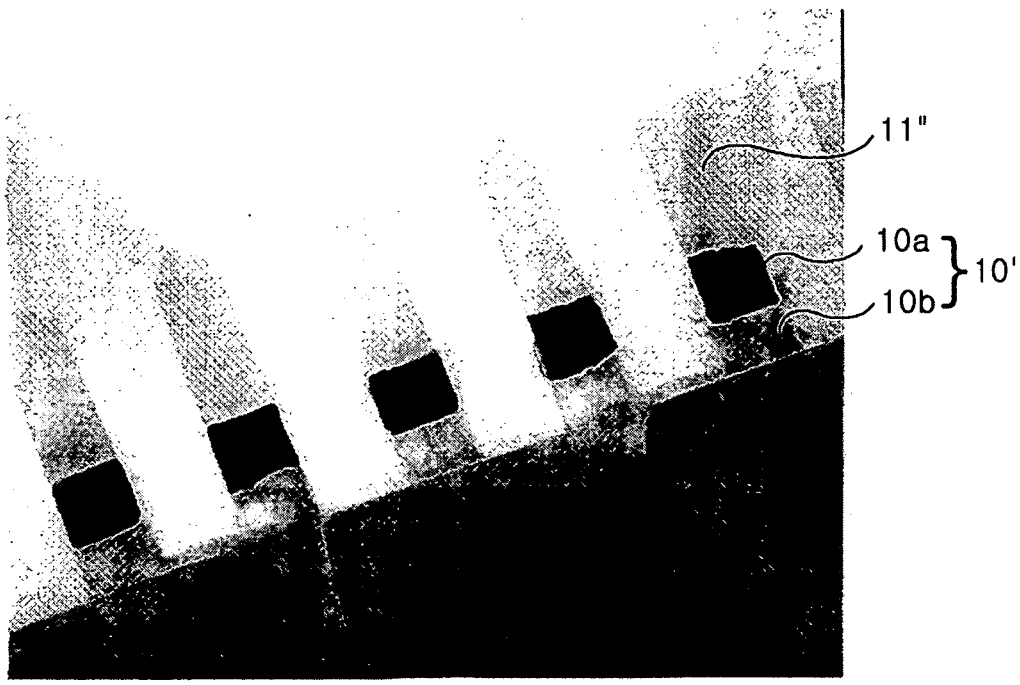
FIG. 4 is a photograph taken by a TEM showing a conducting later pattern having a stacked structure of tungsten and polysilicon layers.
Figure 5A:
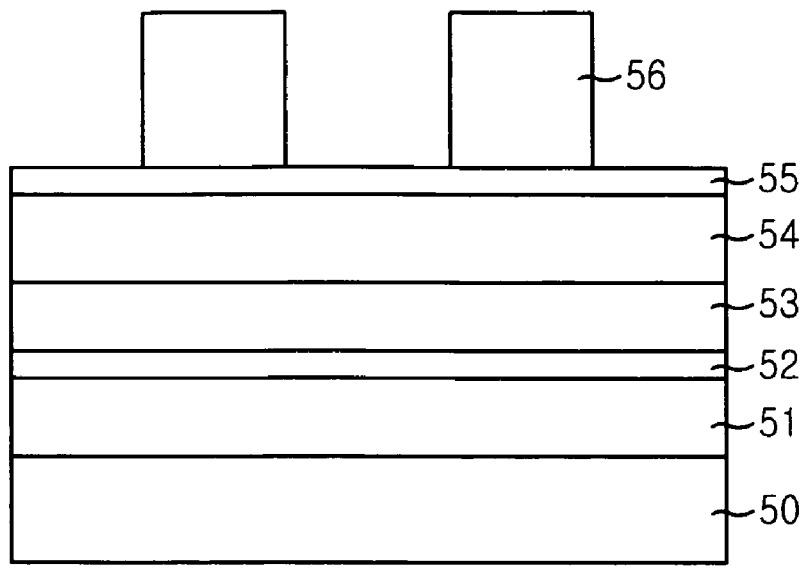
FIG. 5A to 5D are cross-sectional views illustrating a method for forming a conducting layer pattern in a semiconductor device according to a first embodiment of the present invention.

First, referring to FIG. 5A, a conducting layer 51 to be etched is formed on a semiconductor substrate 50 on which different elements have been formed to implement a semiconductor device and a first layer 52 for a first hard mask, a second layer 53 for a second hard mask and a third layer 54 for a third hard mask are respectively formed in this order. The conducting layer 51 is a material selected from the group consisting of a tungsten layer, a titanium layer, a tungsten silicide layer and a titanium nitride layer. The first layer 52 for the first hard mask is a doped polysilicon layer or an undoped polysilicon layer and the second layer 53 for the second hard mask is a nitride layer, such as an oxynitride layer or a silicon nitride layer. Since the third layer 54 for the third hard mask is used as a sacrificial layer, this may be selected from the same materials as the conducting layer 51. The first layer 52 for the first hard mask has a thickness in a range of 50 Å~100 Å and the third layer 54 for the third hard mask has a thickness in a range of 500 Å~1000 Å. The first layer 52 is relatively thinner than the third layer 54.

Next, an antireflective coating layer 55 is deposited on the third layer 54 in order to prevent a random reflection in the photolithography process and to improve adhesive strength to the lower layer for an ArF photoresist layer. A photoresist layer 56 is formed on the antireflective coating layer 55 to form a predetermined pattern such as a gate electrode pattern. Organic materials may be used as the antireflective coating layer 55 and the photoresist layer 56 may be an ArF photoresist or any polymer of a COMA (CycloOlefin-Maleic Anhydride), Acrylate system and a mixture thereof.

Figure 5B:
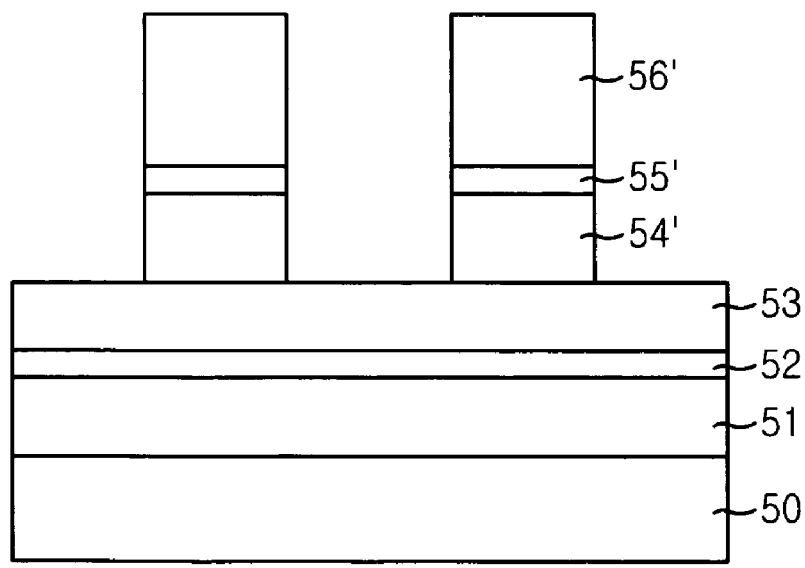

Referring to FIG. 5B, the antireflective coating layer 55 and the third layer 54 for the third hard mask are etched using the photoresist layer 56 as an etching mask. By etching the antireflective coating layer 55 and the third layer 54, an antireflective coating pattern 55' and a hard mask pattern 54' are formed and a pattern area is defined. At this time, the photoresist layer 56 is partially etched with the formation a photoresist pattern 56'.

Figure 5C:
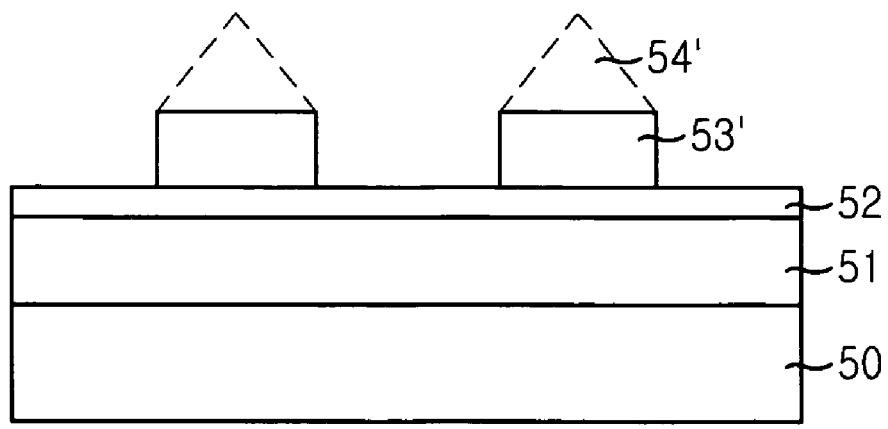

Referring to FIG. 5C, a photoresist strip process is carried out to remove the photoresist pattern 56' and the antireflective coating pattern 55' and the second layer 53 is etched using the hard mask pattern 54' to form a stacked structure of the hard mask pattern 54' and a hard mask pattern 53'. At this time, the top portion of the hard mask pattern 54' is lost when the hard mask pattern 53' is formed so that a spire-shaped mask pattern 54" is formed.

On the other hand, it is possible to naturally remove the photoresist pattern 56' and the antireflective coating pattern 55' at the formation of the hard mask pattern 53' without carrying out the photoresist strip process.

In the first embodiment of the present invention, since the spire-shaped mask pattern 54" can be projected to the lower layer, the spire-shaped mask pattern 54" (shown in dotted lines) is removed by a wet etching process using SC-1 ($NH_4OH:H_2O_2:H_2O=1:4:20$) solution. Also, since the spire-shaped mask pattern 54" is used as a sacrificial layer and is the same material as the conducting layer 51, the conducting layer 51 may be lost by the wet etching process. Accordingly, the first layer 52 for a first hard mask is positioned on the conducting layer 51.

Figure 5D:
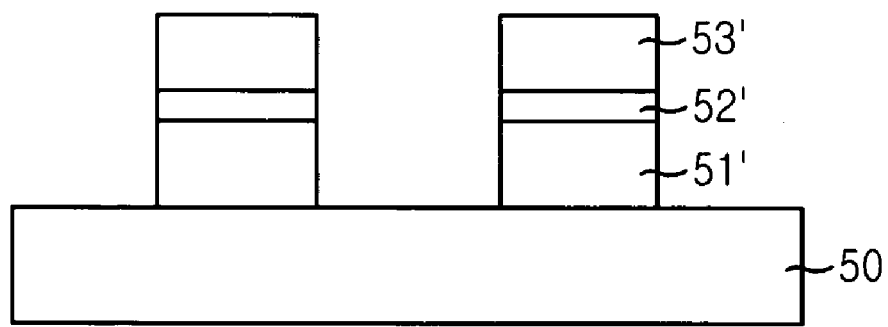

Referring to FIG. 5D, the first layer 52 and the conducting layer 51 are etched using the hard mask pattern 53' as an etching mask, thereby forming a stacked hard mask pattern of a hard mask pattern 53' and a hard mask pattern 52' on a conducting pattern 51'.

In this embodiment, since the triple hard mask structure is used and the spire-shaped mask pattern 54" is removed with the planarization on the hard mask pattern 53', the etching profile of the hard mask pattern 52' and the conducting layer 51 is not damaged.

FIG. 6A to 6D are cross-sectional views illustrating a method for forming a conducting layer pattern in a semiconductor device according to a second embodiment of the present invention.

Figure 6A:
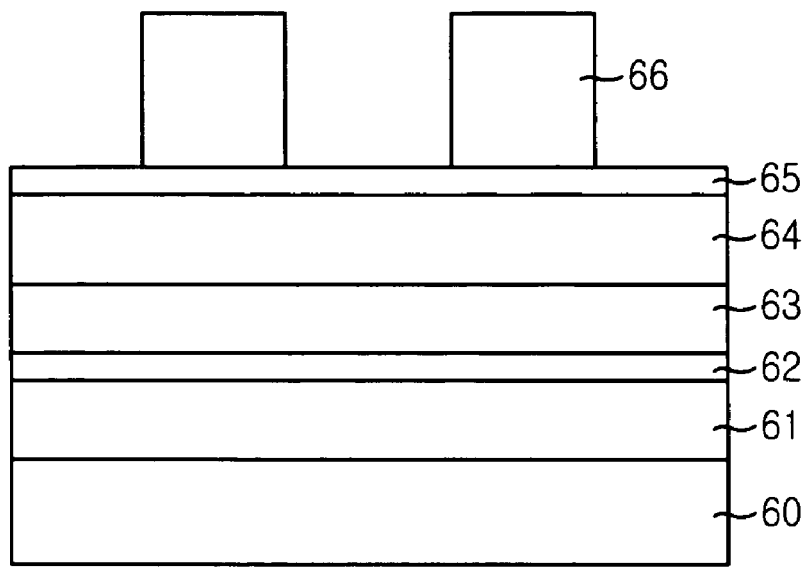
FIG. 6A to 6D are cross-sectional views illustrating a method for forming a conducting layer pattern in a semiconductor device according to a second embodiment of the present invention.

First, referring to FIG. 6A, a conducting layer 61 to be etched is formed on a semiconductor substrate 60 on which different elements have been formed to implement a semiconductor device and a first layer 62 for a first hard mask, a second layer 63 for a second hard mask and a third layer 64 for a third hard mask are respectively formed in this order. The conducting layer 61 is a material selected from the group consisting of a tungsten layer, a titanium layer, a tungsten silicide layer and a titanium nitride layer.

The first layer 62 for the first hard mask is a LPCVD (Low Pressure Chemical Vapor Deposition) oxynitride layer and the second layer 63 for the second hard mask is a PECVD (Plasma Enhancement Chemical Vapor Deposition) oxynitride layer. The PECVD method produces the oxynitride layer at a high deposition rate. Since the density of the oxynitride formed by the LPCVD method is higher than that formed by the PECVD method, the thickness of the LPCVD oxynitride layer can be thinner than that of the PECVD oxynitride layer. To maximize this characteristic in this embodiment, the thickness of the second layer 63 of the PECVD oxynitride layer is two or more times as thick as the first layer 62 of the LPCVD oxynitride layer.

Since the third layer 64 for the third hard mask is used as a sacrificial layer, this may be selected from the same materials as the conducting layer 61.

In case the third layer 64 and the conducting layer 61 are the same tungsten layers, since the tungsten layers are etched by $SF_6/N_2$ plasma, a change of the ArF photoresist pattern can be minimized by using $CF_4/CHF_3/Ar$ plasma at the time of etching a nitride layer. Accordingly, in the ArF photolithography process, a third layer 64 is preferably selected for the tungsten layer rather than a nitride layer.

An antireflective coating layer 65 is deposited on the third layer 64 in order to prevent a random reflection in the photolithography process and to improve adhesive strength to the lower layer for an ArF photoresist layer.

A photoresist layer 66 is formed on the antireflective coating layer 65 to form a predetermined pattern such as a gate electrode pattern. Organic materials may be used as the antireflective coating layer 65 and the photoresist layer 66 is an ArF photoresist or any polymer of a COMA (CycloOlefin-Maleic Anhydride), Acrylate system and a mixture thereof.

Figure 6B:
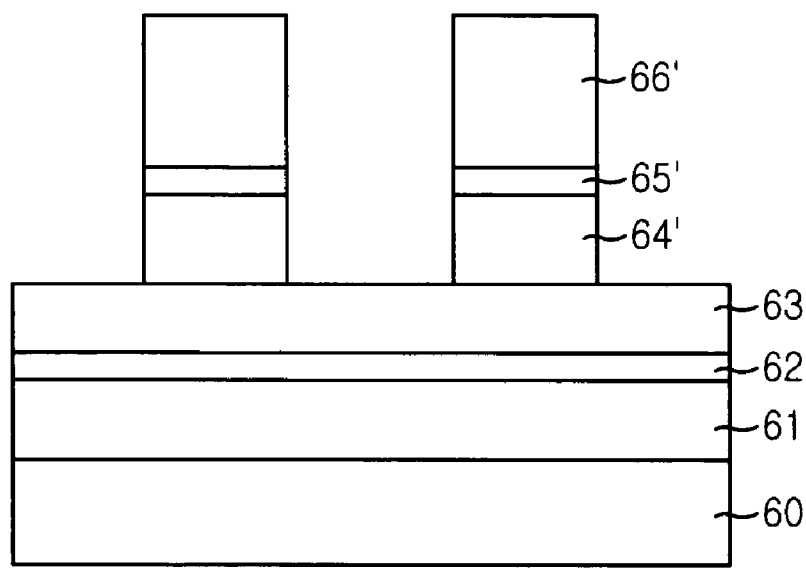

Referring to FIG. 6B, the antireflective coating layer 65 and the third layer 64 for the third hard mask are etched using the photoresist layer 66 as an etching mask. By etching the antireflective coating layer 65 and the third layer 64, an antireflective coating pattern 65' and a hard mask pattern 64' are formed and a pattern area is defined. At this time, the photoresist layer 66 is partially etched with the formation a photoresist pattern 66'.

Figure 6C:
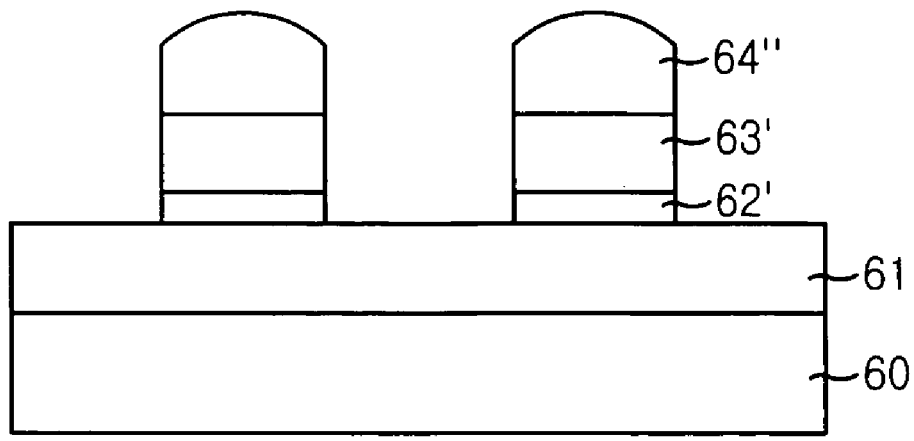

Referring to FIG. 6C, a photoresist strip process is carried out to remove the photoresist pattern 66' and the antireflective coating pattern 65' and the second layer 63 and the third layer 62 are etched using the hard mask pattern 64' to form a triple stacked structure of the hard mask pattern 64', a hard mask pattern 63' and a hard mask pattern 62'. At this time, the top portion of the hard mask pattern 64' is lost when the hard mask pattern 63' is formed so that a round-shaped mask pattern 64" is formed at the top thereof.

On the other hand, it is possible to naturally remove the photoresist pattern 66' and the antireflective coating pattern 65' at the formation of the hard mask pattern 63' and the hard mask pattern 62' without carrying out the photoresist strip process.

Figure 6D:
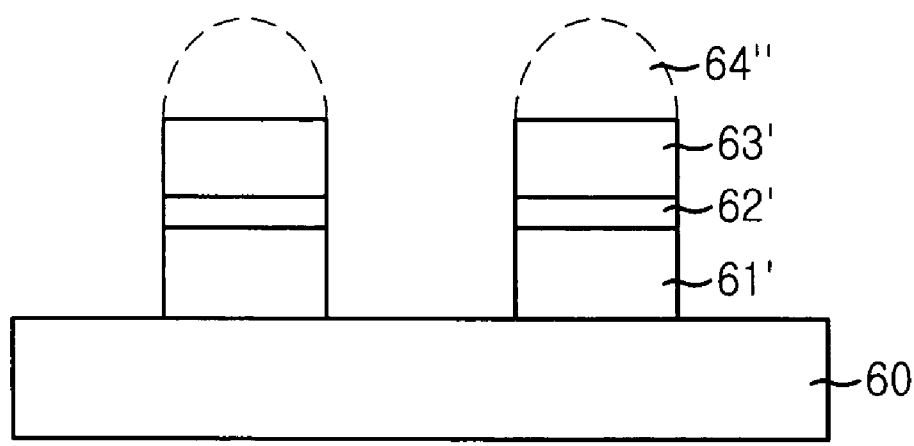

Referring to FIG. 6D, the conducting layer 61 is etched using the round-shaped mask pattern 64", the hard mask pattern 63' and the hard mask pattern 62' as an etching mask, thereby forming a stacked hard mask pattern of the hard mask pattern 63' and the hard mask pattern 62' on a conducting pattern 61'. This embodiment can carry out an additional step of eliminating the round-shaped mask pattern 64"; however, the round-shaped mask pattern 64" can be removed at the time of etching the conducting layer 61 without such an additional step.

In the second embodiment of the present invention, the spire-shaped mask pattern 64" and the conducting pattern 61' can be the same materials. The round-shaped mask pattern 64" (shown in dotted lines) is removed at the time of patterning the conducting layer 61.

As stated above in the first and second embodiments, since the triple hard mask structure is used for making the conducting pattern and the spire or round-shaped mask pattern is removed, the projection of the spire or round-shaped mask pattern is prevented and the etching profile of the lower mask patterns are not damaged.

FIG. 7A to 7E are cross-sectional views illustrating a method for forming a conducting layer pattern in a semiconductor device according to a third embodiment of the present invention.

Figure 7A:
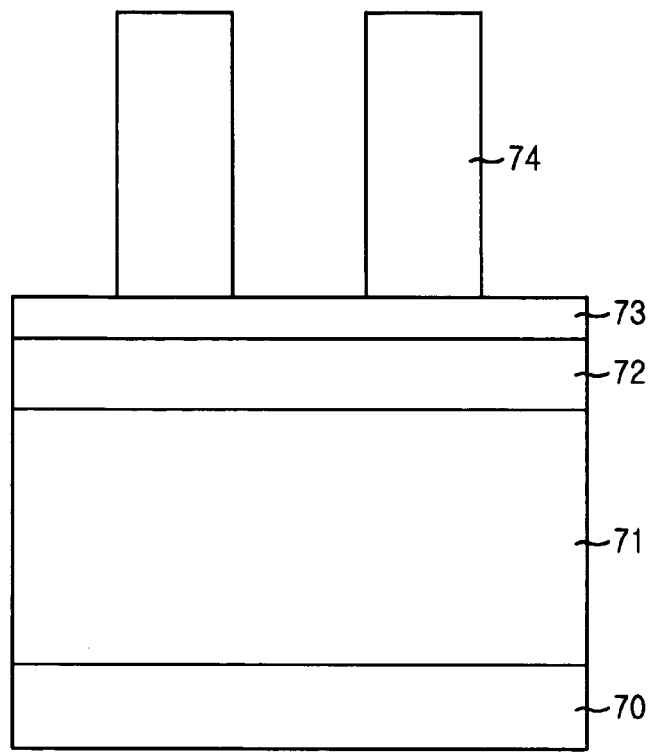
FIG. 7A to 7E are cross-sectional views illustrating a method for forming a conducting layer pattern in a semiconductor device according to a third embodiment of the present invention.

First, referring to FIG. 7A, a conducting layer 70 to be etched is formed on a semiconductor substrate (not shown) on which different elements have been formed to implement a semiconductor device and a first layer 71 for a first hard mask and a second layer 72 for a second hard mask are respectively formed on the conducting layer 70 in this order.

The first layer 71 for the first hard mask is a nitride layer, such as an oxynitride layer or a silicon nitride layer and the second layer 72 for the second hard mask is a material selected from the group consisting of a tungsten layer and a tungsten nitride layer.

Next, an antireflective coating layer 73 is deposited on the second layer 72 in order to prevent a random reflection in the photolithography process and to improve adhesive strength to the lower layer for an ArF photoresist layer. A photoresist layer 74 is formed on the antireflective coating layer 73 to form a predetermined pattern such as a gate electrode pattern. The conducting layer 70 is a material selected from the group consisting of a tungsten layer, a titanium layer, a tungsten silicide layer and a tungsten nitride layer.

Organic materials may be used as the antireflective coating layer 73 and the photoresist layer 74 is an ArF photoresist or any polymer of a COMA (CycloOlefin-Maleic Anhydride) systems and a mixture thereof.

Figure 7B:
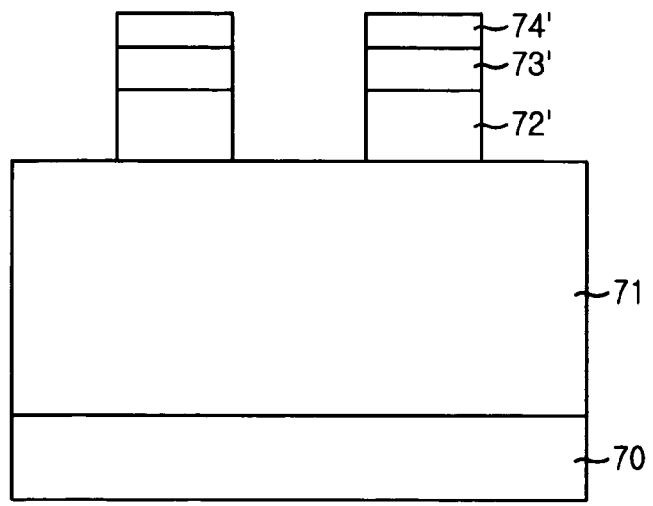

Referring to FIG. 7B, the antireflective coating layer 73 and the second layer 72 for the second hard mask are etched using the photoresist layer 74 as an etching mask. By etching the antireflective coating layer 73 and the second layer 72, an antireflective coating pattern 73' and a hard mask pattern 72' are formed and a pattern area is defined. At this time, the photoresist layer 74 is partially etched with the formation of a photoresist pattern 74'.

Figure 7C:
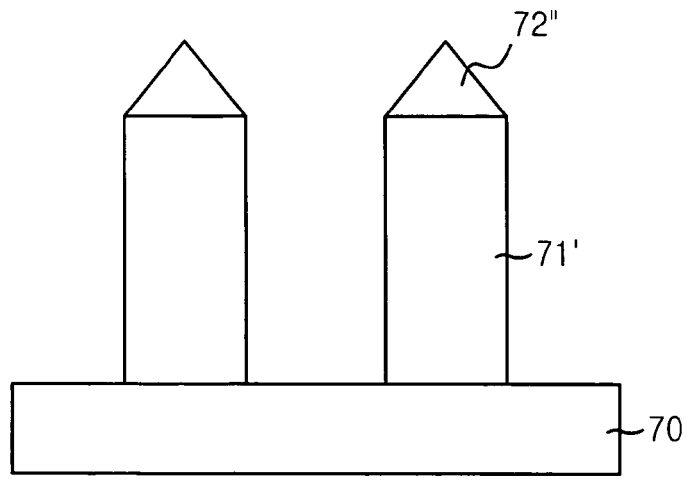

Referring to FIG. 7C, the first layer 71 for the first hard mask is etched using the photoresist pattern 74', the antireflective coating pattern 73' and the second hard mask pattern 72' as etching masks, thereby forming a stacked structure of the hard mask pattern 71' and the spire-shaped mask pattern 72". The top portion of the hard mask pattern 72' is lost when the hard mask pattern 71' is formed so that a spire-shaped mask pattern 72" is formed. At this time, the photoresist pattern 74' and the antireflective coating pattern 73' are naturally removed.

In the third embodiment of the present invention, since the hard mask pattern 71' can also have such a spire-shaped pattern when the spire-shaped mask pattern 72" is projected to the lower layer, the spire-shaped mask pattern 72" is removed.

Figure 7D:
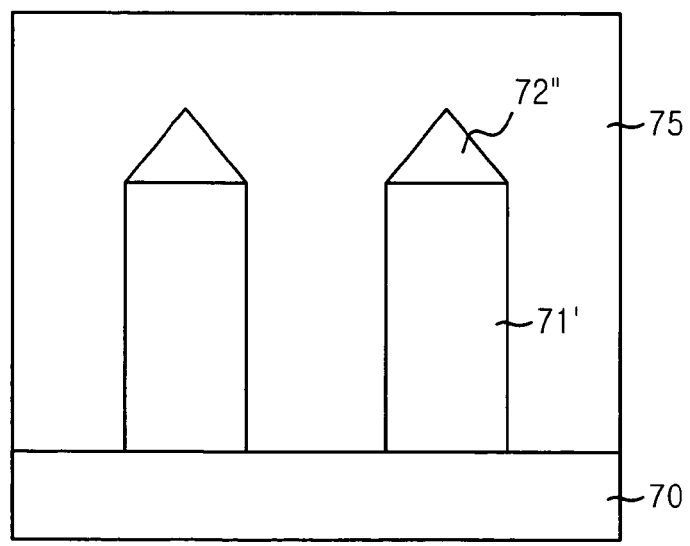
Figure 7E:
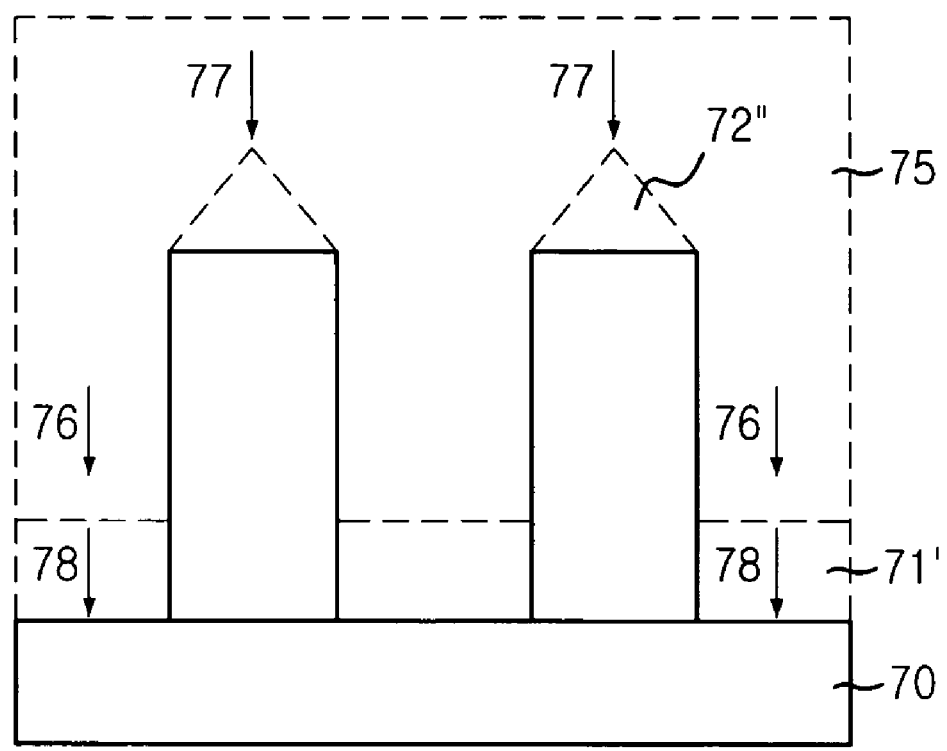

FIGS. 7D and 7E cross-sectional views illustrating a method of removing the spire-shaped mask pattern 72".

First, as shown in FIG. 7D, a flowable insulation layer or an organic polymer 75 is deposited on the resulting structure having the first hard mask pattern 71' and the spire-shaped mask pattern 72". The flowable insulation layer or the organic polymer 75 includes a SOG or APL layer and has a gap-fill characteristic with the flowing and planarization ability.

As shown in FIG. 7E, the polymer 75 and the spire-shaped mask pattern 72" are removed by three steps of wet etching processes. If the flowable insulation layer is used, it is an oxide layer and a fluoride solution is used as an etchant. If the organic polymer is used, $O_2$ plasma is used as an etchant. Since the spire-shaped mask pattern 72" is a tungsten material, SC-1 ($NH_4OH:H_2O_2:H_2O=1:4:20$) solution is used as an etchant.

A portion of the flowable insulation layer 75 is removed by a wet etching process using the fluoride solution and the height of the removed portion is a half of that of the first hard mask pattern 71' (see reference numeral "76"). The spire-shaped mask pattern 72" is removed by a wet etching process using SC-1 ($NH_4OH:H_2O_2:H_2O=1:4:20$) solution (see reference numeral "77"). A remaining insulation layer from the flowable insulation layer 75 is removed by a wet etching process using the fluoride solution (see reference numeral "78"). Further, the conducting layer 70 is patterned using the first hard mask pattern 71' as an etching mask, which is not shown.

Figure 8:
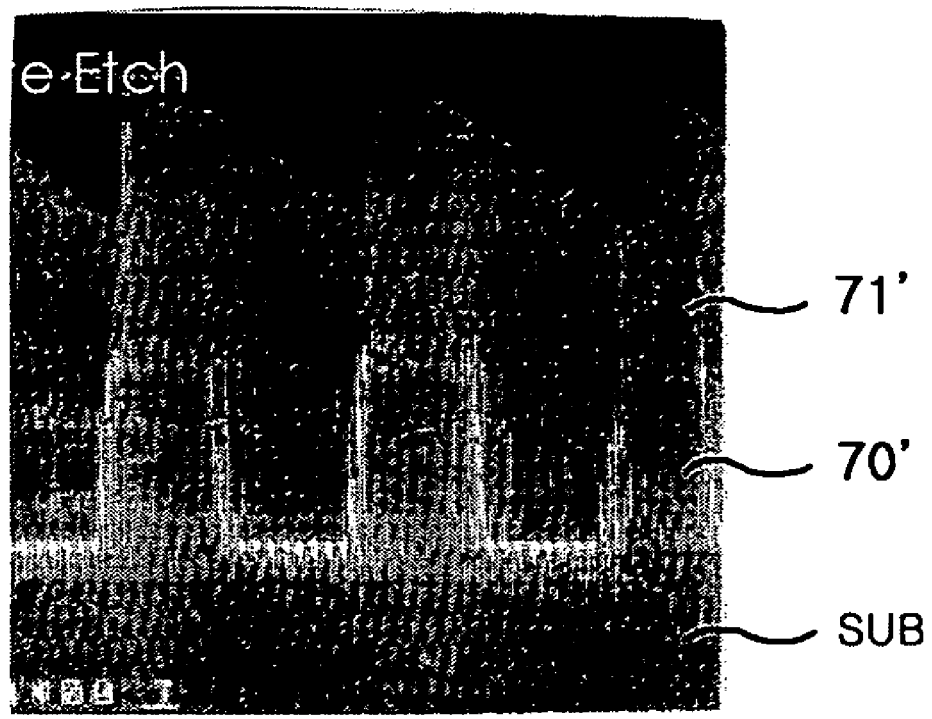
FIG. 8 is a photograph taken by a SEM showing a semiconductor device having a conducting layer pattern according to the present invention.

FIG. 8 is a photograph taken by a SEM showing a conducting layer pattern according to the present invention.

Referring to FIG. 8, the first hard mask pattern 71' is subjected to a planarization process through the deposition of the flowable insulation layer 75 and the removal of the spire-shaped mask pattern 72" via three step wet etching processes with only a limited attack on the conducting layer 70. In FIG. 8, the reference SUB denotes a substrate and 70' denotes a conducting layer pattern.

In the third embodiment of the present invention, a dual hard mask is used when patterning the conducting layer, the second hard mask pattern having a spire shape at the top thereof is removed by the deposition of the flowable insulation layer and three step wet etching processes. As a result, the spire-shaped mask pattern is not projected to the lower layer so that a continuous generation of spire shape is not prevented.

As apparent from the present invention, a tapered profile of the hard mask is prevented and the yield of the semiconductor devices increases.

While the present invention has been described with respect to the particular embodiments, it will be apparent to those skilled in the art that various changes and modifications may be made without departing from the spirit and scope of the invention as defined in the following claims. Although the conducting layer in the present invention is illustrated, for example, the conducting layer is applicable to a bit line or other metal wires.

What is claimed is:

1. A method for fabricating a semiconductor device using an ArF exposure light source, comprising the steps of:

forming a conducting layer on a semiconductor substrate;

forming a first hard mask layer, a second hard mask layer and a third hard mask layer on the conducting layer in order;

forming a photoresist pattern on the third hard mask layer using an ArF exposure light source in order to form a given pattern;

forming a first hard mask pattern by etching the third hard mask layer using the photoresist pattern as an etching mask;

forming a second hard mask pattern by etching the second hard mask layer using the first hard mask pattern as an etching mask;

removing the first hard mask pattern; and etching the first hard mask layer and the conducting layer using the second hard mask pattern as an etching mask and forming a stacked hard mask pattern having the conducting layer and the second and third hard mask patterns, wherein the third hard mask pattern is formed from the first hard mask layer, wherein the third hard mask layer includes the same materials as the conducting layer.

2. The method in accordance with claim 1, wherein the first hard mask layer is a doped polysilicon layer or an undoped polysilicon layer.

3. The method in accordance with claim 1, wherein the second hard mask layer is an oxynitride layer or a silicon nitride layer.

4. The method in accordance with claim 1, wherein the third hard mask layer is etched by an SC-1 ($NH_4OH:H_2O_2:H_2O=1:4:20$) solution.

5. The method in accordance with claim 1, wherein the first hard mask layer has a thickness in a range of 50 Å~100 Å.

6. The method in accordance with claim 1, wherein the photoresist pattern is a gate electrode pattern, a bit line pattern or a metal line pattern.

7. A method for fabricating a semiconductor device using an ArF exposure light source, comprising the steps of:

forming a conducting layer on a semiconductor substrate;

forming a first hard mask layer, a second hard mask layer and a third hard mask layer on the conducting layer in order;

forming a photoresist pattern on the third hard mask layer using an ArF exposure light source;

forming a first hard mask pattern by etching the third hard mask layer using the photoresist pattern as an etching mask;

etching the second hard mask layer and the first hard mask layer using at least the first hard mask pattern and forming a triple stacked hard mask pattern having the first hard mask pattern, a second hard mask pattern and a third hard mask pattern, wherein the second and the third hard mask pattern are formed from the second and the first hard mask layer, respectively; and etching the conducting layer using triple stacked hard mask pattern as an etching mask and simultaneously removing the first hard mask pattern, whereby a stacked structure having the conducting layer, the second hard mask pattern and the third hard mask pattern is formed, wherein the third hard mask layer includes the same materials as the conducting layer.

8. The method in accordance with claim 7, wherein the first hard mask layer is a LPCVD oxynitride layer and the second layer is a PECVD oxynitride layer.

9. The method in accordance with claim 7, wherein the second hard mask layer is twice or more times as thick as the first layer.

10. The method in accordance with claim 7, further comprising the step of forming an antireflective coating layer on the third hard mask layer.

* * * * *